US007725793B2

(12) United States Patent
Yamada et al.

(10) Patent No.: US 7,725,793 B2
(45) Date of Patent: May 25, 2010

(54) PATTERN GENERATION FOR TEST APPARATUS AND ELECTRONIC DEVICE

(75) Inventors: Tatsuya Yamada, Tokyo (JP); Tomoyuki Sugaya, Tokyo (JP)

(73) Assignee: Advantest Corporation, Tokyo (JP)

( * ) Notice: Subject to any disclaimer, the term of this patent is extended or adjusted under 35 U.S.C. 154(b) by 564 days.

(21) Appl. No.: 11/689,506

(22) Filed: Mar. 21, 2007

(65) Prior Publication Data

US 2008/0235550 A1 Sep. 25, 2008

(51) Int. Cl.
*G01R 31/28* (2006.01)
*G06F 11/00* (2006.01)

(52) U.S. Cl. .................................. 714/738; 714/703

(58) Field of Classification Search ............... 714/703, 714/715, 724, 738
See application file for complete search history.

(56) References Cited

U.S. PATENT DOCUMENTS

| 4,875,210 | A | * | 10/1989 | Russo et al. ............... 714/743 |
| 5,696,772 | A | * | 12/1997 | Lesmeister ................. 714/32 |
| 5,748,642 | A | * | 5/1998 | Lesmeister ................. 714/724 |
| 6,073,263 | A | * | 6/2000 | Arkin et al. ................ 714/738 |
| 6,591,213 | B1 | * | 7/2003 | Burlison .................... 702/119 |
| 6,598,112 | B1 | * | 7/2003 | Jordan et al. .............. 711/2 |
| 2004/0103357 | A1 | * | 5/2004 | Nishida et al. ............. 714/738 |

FOREIGN PATENT DOCUMENTS

| JP | 2001-194431 | 7/2001 |
| JP | 2003-130926 | 5/2003 |

OTHER PUBLICATIONS

"Test Generation in the Presence of Timing Exceptions and Constraints" by Goswami et al. This paper appears in: Design Automation Conference, 2007. DAC '07. 44th ACM/IEEE Publication Date: Jun. 4-8, 2007 On pp. 688-693 ISSN: 0738-100X ISBN: 978-1-59593-627-1 INSPEC Accession No. 9867030.*

"Efficient and robust test generation-based timing analysis" by Silva et al. This paper appears in: Circuits and Systems, 1994. ISCAS '94., 1994 IEEE International Symposium on Publication Date: May 30-Jun. 2, 1994 vol. 1, on pp. 303-306 vol. 1 ISBN: 0-7803-1915-X INSPEC Accession No. 4991777.*

* cited by examiner

*Primary Examiner*—Cynthia Britt
(74) *Attorney, Agent, or Firm*—Osha • Liang LLP

(57) ABSTRACT

There is provided a test apparatus for testing a device under test. The test apparatus includes a main instruction storing section that stores thereon a main test instruction sequence, a sub instruction storing section that stores thereon a sub test instruction sequence which is executed when a subroutine call instruction included in the main test instruction sequence is executed, a pattern generating section that (i) sequentially reads and executes an instruction from the main test instruction sequence and outputs (I) a test pattern associated with the executed instruction and (II) timing set information designating a combination of timings for output of the test pattern, (ii) under a condition of executing the subroutine call instruction, sequentially reads and executes an instruction from the sub test instruction sequence designated by the executed subroutine call instruction and outputs (1) a test pattern associated with the executed instruction and (2) timing set information for a test pattern associated with the subroutine call instruction or an instruction which precedes the subroutine call instruction in the main test instruction sequence, and a test signal output section that generates a test signal in accordance with the test pattern, and supplies the test signal to the device under test at a timing designated by the timing set information.

8 Claims, 11 Drawing Sheets

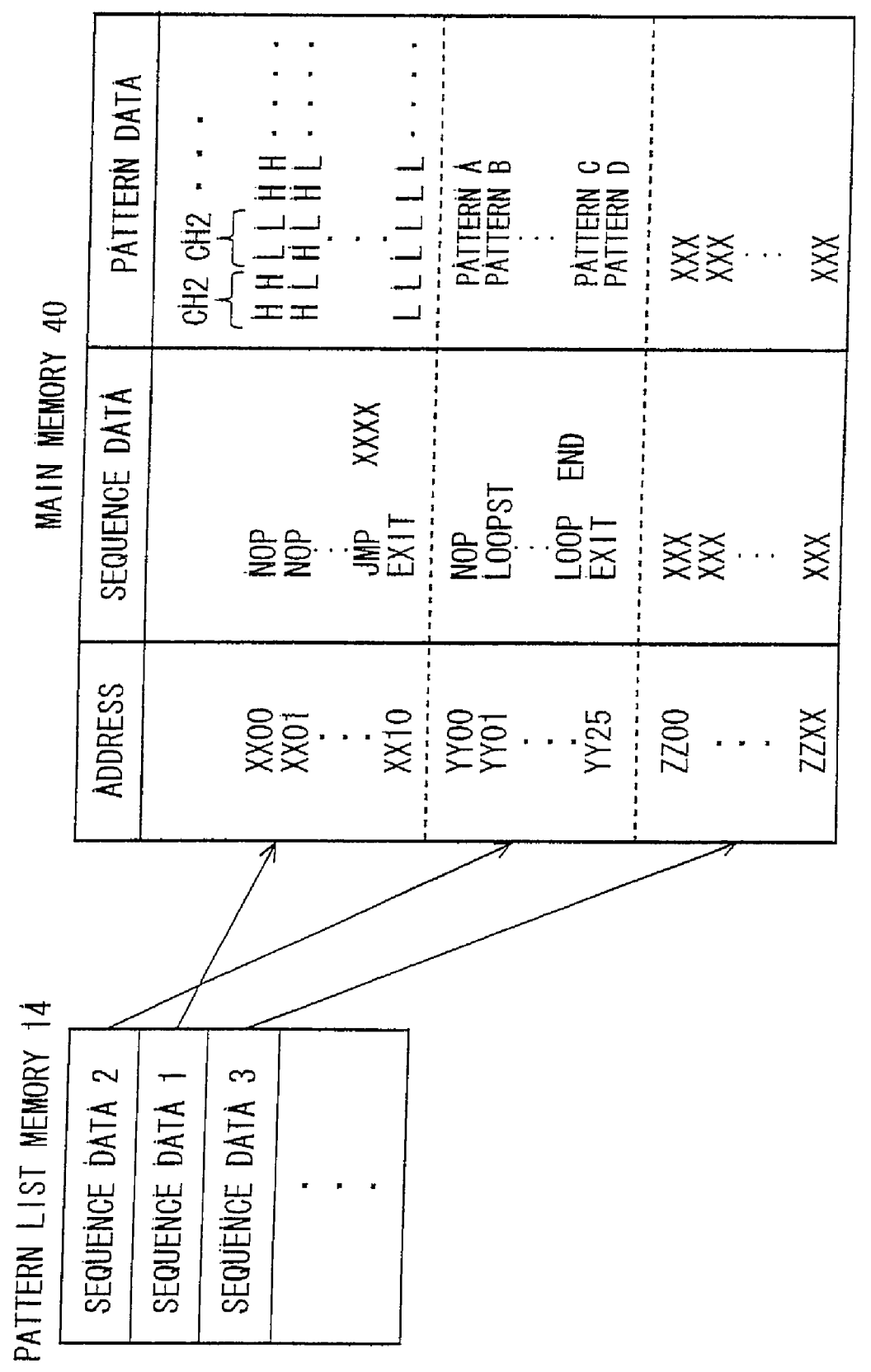

| | MAIN MEMORY 40 | | |
|---|---|---|---|
| ADDRESS | SEQUENCE DATA | PATTERN DATA | |
| XX00<br>XX01<br>...<br>XX10 | NOP<br>NOP<br>...<br>JMP XXXX<br>EXIT | CH2 CH2 ...<br>H H L L H H ...<br>H L H L H L ... | PATTERN DATA |
| YY00<br>YY01<br>...<br>YY25 | NOP<br>LOOPST<br>...<br>LOOP END<br>EXIT | L L L L L ...<br>PATTERN A<br>PATTERN B<br>PATTERN C<br>PATTERN D | |
| ZZ00<br>...<br>ZZXX | XXX<br>XXX<br>XXX | XXX<br>XXX<br>XXX | |

PATTERN LIST MEMORY 14

| SEQUENCE DATA 2 | SEQUENCE DATA 1 | SEQUENCE DATA 3 | ... |

FIG. 3

TIMING SET TABLE

| SET NUMBER | T1 | T2 | T3 | T4 | TEST RATE (Rate) |
|---|---|---|---|---|---|
| TS1 | XXX | XXX | XXX | XXX | XXX |
| TS2 | XXX | XXX | XXX | XXX | XXX |
| TS3 | XXX | XXX | XXX | XXX | XXX |
| ... | ... | ... | ... | ... | ... |
| TS256 | XXX | XXX | XXX | XXX | XXX |

FIG. 7

PATTERN GENERATION FOR TEST APPARATUS AND ELECTRONIC DEVICE

BACKGROUND

1. Technical Field

The present invention relates to a test apparatus and an electronic device. More particularly, the present invention relates to a test apparatus for testing a device under test and an electronic device including therein a test circuit for testing a circuit under test.

2. Related Art

A test apparatus is known which tests a device under test (DUT) such as a semiconductor circuit. The test apparatus supplies a test signal having a predetermined logical pattern to the DUT, detects a signal output from the DUT in response to the supplied test signal, and compares the detected signal with an expected value, to judge whether the DUT is acceptable.

The test apparatus includes therein a pattern generator for sequentially generating a test pattern and a test signal output section for outputting a test signal having a logical pattern corresponding to the test pattern. The pattern generator sequentially reads an instruction from sequence data (a test instruction sequence) stored on a memory, and executes the read instruction. The pattern generator then reads from the memory pattern data corresponding to the executed instruction, and sequentially outputs the read pattern data as the test pattern. In this way, the test apparatus can supply the test signal having a predetermined logical pattern to the DUT.

The pattern generator can also execute sequence data described by using subroutines as disclosed in Unexamined Japanese Patent Application Publication No. 2001-194431, for example. When executing a subroutine call instruction described within a main test instruction sequence, the pattern generator reads a corresponding sub test instruction sequence from the memory and executes the read sub test instruction sequence. In this way, the pattern generator enables a test instruction sequence that is repeatedly executed to be stored as a single instruction sequence.

Here, the sequence data has therein timing set information described in correspondence with each instruction. The timing set information designates a timing of outputting a corresponding test pattern. Therefore, the pattern generator executes different instructions for generating test patterns which are the same but generated at different timings. In other words, the pattern generator can not store, as a single subroutine, test instruction sequences which generate the same test pattern but have different timings for the test pattern generation to be stored.

SUMMARY

In view of the above, an advantage of some embodiments of the present invention is to provide a test apparatus and an electronic device which can solve the above-mentioned problem. This advantage is achieved by combining the features recited in the independent claims. The dependent claims define further effective specific example of the present invention.

A first embodiment of the present invention provides a test apparatus for testing a device under test. The test apparatus includes a main instruction storing section that stores thereon a main test instruction sequence, a sub instruction storing section that stores thereon a sub test instruction sequence which is executed when a subroutine call instruction included in the main test instruction sequence is executed, a pattern generating section that (i) sequentially reads and executes an instruction from the main test instruction sequence and outputs (I) a test pattern associated with the executed instruction and (II) timing set information designating a combination of timings for output of the test pattern, (ii) under a condition of executing the subroutine call instruction, sequentially reads and executes an instruction from the sub test instruction sequence designated by the executed subroutine call instruction and outputs (1) a test pattern associated with the executed instruction and (2) timing set information for a test pattern associated with the subroutine call instruction or an instruction which precedes the subroutine call instruction in the main test instruction sequence, and a test signal output section that generates a test signal in accordance with the test pattern, and supplies the test signal to the device under test at a timing designated by the timing set information.

A second embodiment of the present invention provides a test apparatus for testing a device under test. The test apparatus includes a main instruction storing section that stores thereon a main test instruction sequence, a pattern generating algorithm storing section that stores thereon a pattern generating algorithm which is executed when an algorithm call instruction included in the main test instruction sequence is executed, a pattern generating section that (i) sequentially reads and executes an instruction from the main test instruction sequence and outputs (I) a test pattern associated with the executed instruction and (II) timing set information designating a combination of timings for output of the test pattern, and (ii) under a condition of executing the algorithm call instruction, reads the pattern generating algorithm designated by the executed algorithm call instruction and outputs (1) a test pattern in accordance with the read pattern generating algorithm and (2) timing set information for a test pattern associated with the algorithm call instruction or an instruction, in the main test instruction sequence, which precedes the algorithm call instruction, and a test signal output section that generates a test signal in accordance with the test pattern, and supplies the test signal to the device under test at a timing designated by the timing set information.

A third embodiment of the present invention provides an electronic device including a circuit under test, and a test circuit for testing the circuit under test. Here, the test circuit includes a main instruction storing section that stores thereon a main test instruction sequence, a sub instruction storing section that stores thereon a sub test instruction sequence which is executed when a subroutine call instruction included in the main test instruction sequence is executed, a pattern generating section that (i) sequentially reads and executes an instruction from the main test instruction sequence and outputs (I) a test pattern associated with the executed instruction and (II) timing set information designating a combination of timings for output of the test pattern, and (ii) under a condition of executing the subroutine call instruction, sequentially reads and executes an instruction from the sub test instruction sequence designated by the executed subroutine call instruction and outputs (1) a test pattern associated with the executed instruction and (2) timing set information for a test pattern associated with the subroutine call instruction or an instruction which precedes the subroutine call instruction in the main test instruction sequence, and a test signal output section that generates a test signal in accordance with the test pattern, and supplies the test signal to the circuit under test at a timing designated by the timing set information.

A fourth embodiment of the present invention provides an electronic device including a circuit under test, and a test circuit for testing the circuit under test. Here, the test circuit includes a main instruction storing section that stores thereon a main test instruction sequence, a pattern generating algorithm storing section that stores thereon a pattern generating algorithm which is executed when an algorithm call instruction included in the main test instruction sequence is executed, a pattern generating section that (i) sequentially reads and executes an instruction from the main test instruction sequence and outputs (I) a test pattern associated with the executed instruction and (II) timing set information designating a combination of timings for output of the test pattern, and (ii) under a condition of executing the algorithm call instruction, reads the pattern generating algorithm designated by the algorithm call instruction and outputs (1) a test pattern in accordance with the read pattern generating algorithm and (2) timing set information for a test pattern associated with the algorithm call instruction or an instruction which precedes the algorithm call instruction in the main test instruction sequence, and a test signal output section that generates a test signal in accordance with the test pattern, and supplies the test signal to the circuit under test at a timing designated by the timing set information.

Here, all the necessary features of the present invention are not listed in the summary. The sub-combinations of the features may become the invention.

BRIEF DESCRIPTION OF THE DRAWINGS

FIG. 3 illustrates, as an example, a pattern list stored on a pattern list memory 14, and sequence data and pattern data stored on a main memory 40.

FIG. 7 illustrates a table describing the setting of a timing set.

DESCRIPTION OF EXEMPLARY EMBODIMENTS

Hereinafter, one aspect of the present invention will be described through some embodiments. The embodiments do not limit the invention according to the claims, and all the combinations of the features described in the embodiments are not necessarily essential to means provided by aspects of the invention.

Figure 1:
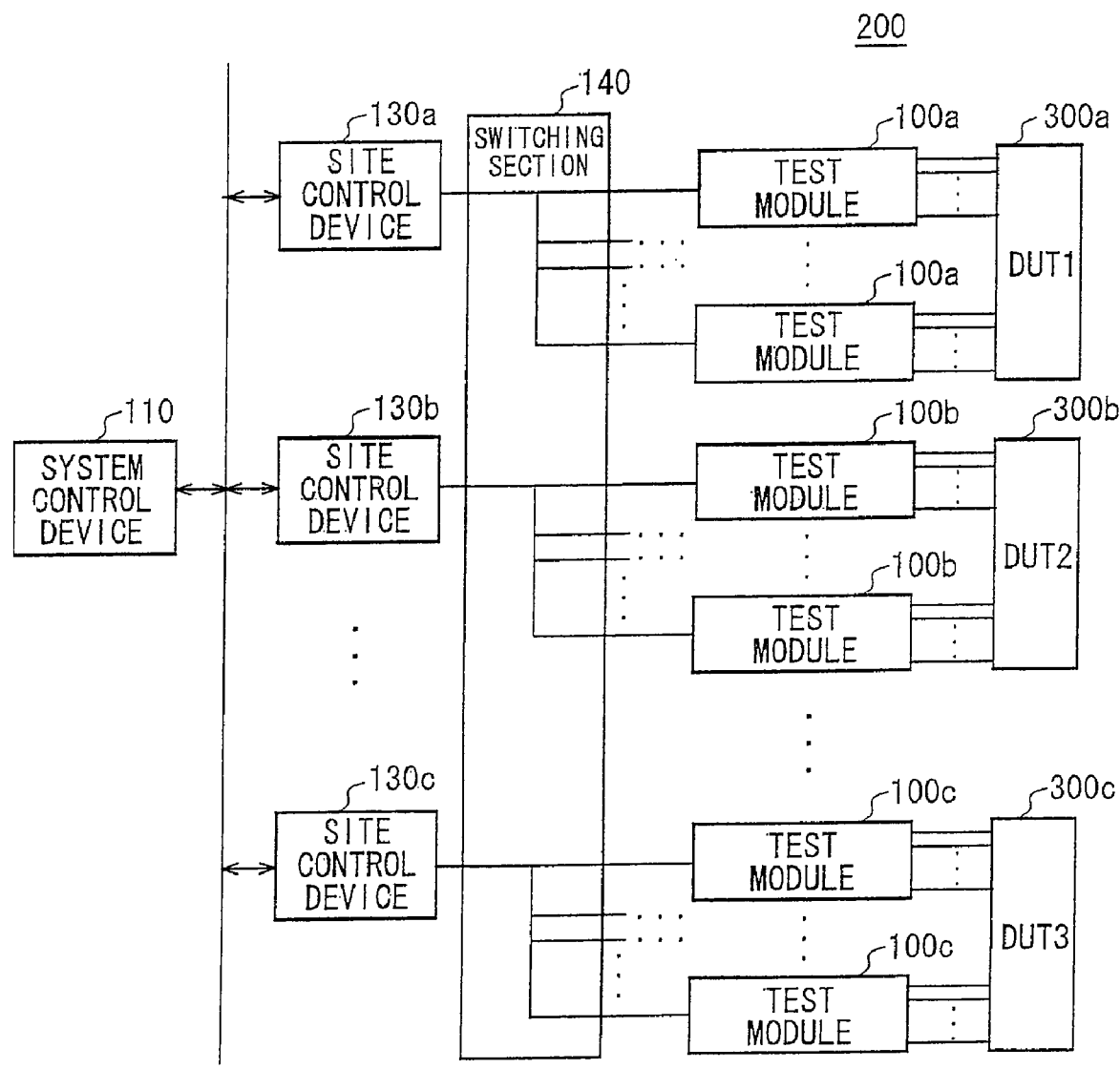
FIG. 1 illustrates an exemplary configuration of a test apparatus 200 relating to an embodiment of the present invention.

FIG. 1 illustrates an exemplary configuration of a test apparatus 200 relating to an embodiment of the present invention.

The test apparatus 200 tests devices under test (DUTs) 300 such as semiconductor circuits. The test apparatus 200 includes therein a system control device 110, a plurality of site control devices 130, a switching section 140, and a plurality of test modules 100.

The system control device 110 receives test control programs, test programs, test data and the like which are used by the test apparatus 200 to test the DUTs 300, via an external network or the like, and stores the received programs and data. The system control device 110 is connected to the plurality of site control devices 130 via a communication network.

The site control devices 130a to 130c respectively control tests conducted on the DUTs 300. For example, the plurality of site control devices 130 are provided in a one-to-one correspondence with the plurality of DUTs 300. Each of the site control devices 130 controls a test conducted on a corresponding one of the DUTs 300.

According to the exemplary configuration shown in FIG. 1, the site control device 130a controls the test conducted on the DUT 300a, and the site control device 130b controls the test conducted on the DUT 300b. As an alternative example, each of the plurality of site control devices 130 may control the tests conducted on more than one of the DUTs 300.

Specifically speaking, each of the site control devices 130 obtains a test control program from the system control device 110, and executes the obtained test control program. Subsequently, based on the test control program, the site control device 130 obtains a test program (for example, sequence data described later) and test data (for example, pattern data described later) to use for a test of a corresponding one of the DUTs 300, from the system control device 110. The site control device 130 stores, via the switching section 140, the obtained test program and test data onto one or more modules (for example, one or more of the test modules 100) which are to be used for testing the corresponding DUT 300. Following this, the site control device 130 instructs, via the switching section 140, the test modules 100 to start conducting a test based on the test program and test data. When receiving an interrupt or the like indicating the completion of the test from, for example, the test modules 100, the site control device 130 instructs the test modules 100 to conduct the next test based on the result of the test.

The switching section 140 connects each of the plurality of site control devices 130 to corresponding one or more of the test modules 100, which are controlled by the site control device 130, and relays the communication between the site control device 130 and corresponding test modules 100. Here, a predetermined one of the site control devices 130 may configure the switching section 140, based on the instruction by the user of the test apparatus 200, test control program or the like, so that each of the plurality of site control devices 130 is connected to one or more of the test modules 100 used by the site control device 130 to test a corresponding one of the DUTs 300.

According to the exemplary configuration shown in FIG. 1, for example, the site control device 130a is configured so as to be connected to a plurality of test modules 100a, and uses the test modules 100a to test the DUT 300a. Here, the configuration and operations of the site control device 130a for testing the DUT 300a are substantially the same as those of the other site control devices 130 for testing the corresponding DUTs 300 by using the corresponding test modules 100. The following description is made with a focus on the configuration and operations of the site control device 130a for testing the DUT 300a.

Based on an instruction by the site control device 130*a*, the test modules 100*a* generate timing signals indicating timings to generate test signals to be used to test the DUT 300*a*. One of the test modules 100*a* may receive a result of a test conducted by a different one of the test modules 100*a*, and cause the test modules 100*a* to execute sequence data corresponding to the received result of the test.

Each of the test modules 100*a* is connected to some of the plurality of terminals of the DUT 300*a*. The test module 100*a* conducts a test of the DUT 300*a* based on the sequence data and pattern data which are stored thereon by the site control device 130*a*. The test module 100*a* tests the DUT 300*a* based on the sequence data designated by a pattern list (described later) and pattern data. Specifically speaking, the test module 100*a* generates test signals based on the pattern data, and supplies the generated test signals to the terminals of the DUT 300*a* connected to the test module 100*a*.

Following this, the test module 100*a* obtains output signals which are output from the DUT 300*a* as a result of operations based on the supplied test signals, and compares the obtained output signals with expected values. Here, when generating the test signals based on the sequence data and pattern data, each of the test modules 100*a* may generate a group of test signals in accordance with a different cycle rate so as to achieve a dynamically different cycle rate for each group of the test signals.

Each of the test modules 100*a* generates an interrupt to the site control device 130*a* when the processes based on the test program are completed, an abnormal condition occurs during the execution of the test program, or the like. The interrupt is sent via the switching section 140 to the site control device 130*a* corresponding to the test module 100*a*, so that the processor provided in the site control device 130*a* handles the interrupt.

Referring to the above-described configurations, the test apparatus 200 is realized based on open architecture. The test apparatus 200 can be configured by using a variety of modules satisfying the open architecture standards. When the test apparatus 200 is used, modules such as the test modules 100 may be inserted into a connection slot of the switching section 140.

In this case, the user or the like of the test apparatus 200 may change, via the site control device 130*a* for example, the connection established by the switching section 140, so that the modules to be used for a test of one of the DUTs 300 are connected to a corresponding one of the site control devices 130 which controls the test to be conducted on the DUT 300. With this configuration, the user of the test apparatus 200 can select appropriate modules depending on information relating to each of the DUTs 300 such as the number of the terminals, the positions of the terminals and the terminal types, and the type of the test, and mount the selected modules on the test apparatus 200.

The test apparatus 200 or test modules 100 may be configured as a test circuit provided in an electronic device in which a circuit under test to be tested by the test circuit is also provided. The test circuit is configured by a BIST circuit or the like of the electronic device. The test circuit tests the circuit under test in order to, for example, judge the acceptability of the electronic device. By conducting the test, the test circuit can examine whether the circuit under test can realize normal operations corresponding to the original purpose of the electronic device.

Alternatively, the test apparatus 200 or test modules 100 may be configured as a test circuit provided in a board or apparatus in which a circuit under test to be tested by the test circuit is also provided. Such a test circuit can also examine whether the circuit under test can realize normal operations corresponding to the original purpose of the board or apparatus, similarly to the above-mentioned case.

Figure 2:
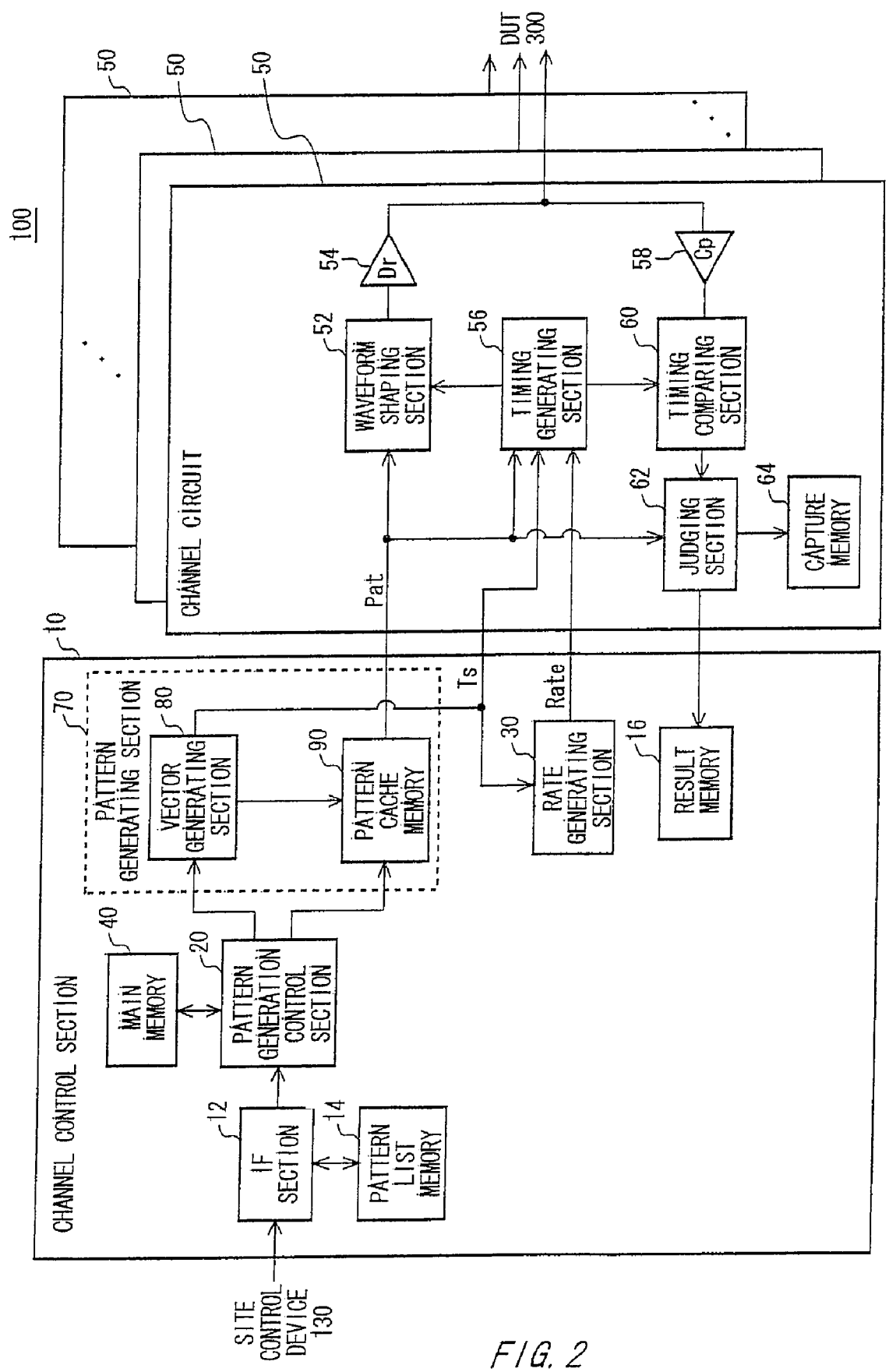
FIG. 2 illustrates an exemplary configuration of a test module 100.

FIG. 2 illustrates an exemplary configuration of each of the test modules 100. The test module 100 includes therein a channel control section 10 and a plurality of channel circuits 50. The following describes the functions and configurations of one of the channel circuits 50. However, all of the channel circuits 50 may have the same functions and configurations.

Each of the channel circuits 50 may be connected to a corresponding one of input/output (I/O) pins of one of the DUTs 300, and supply a test signal to the corresponding I/O pin. The channel circuit 50 may measure an output signal output from the corresponding I/O pin. Here, the I/O pins of the DUT 300 each may be either an input pin or an output pin.

The channel control section 10 controls the channel circuits 50. For example, the channel control section 10 controls each of the channel circuits 50 to cause the channel circuit 50 to generate the test signal. Also, the channel control section 10 controls each of the channel circuits 50 to cause the channel circuit 50 to measure the output signal from the DUT 300.

Here, the channel control section 10 may use a result of the measurement done by one of the channel circuits 50 in order to control one or more of the other channel circuits 50. For example, until the result of the measurement done by one of the channel circuits 50 satisfies a predetermined condition, the channel control section 10 may cause at least one of the remaining channel circuits 50 to perform a predetermined operation repeatedly. When the result of the measurement satisfies the predetermined condition, the channel control section 10 may cause the at least one of the remaining channel circuits 50 to perform the next operation.

The channel control section 10 includes therein an interface (IF) section 12, a pattern list memory 14, a result memory 16, a pattern generation control section 20, a main memory 40, a rate generating section 30, and a pattern generating section 70. The interface section 12 exchanges data between a corresponding one of the site control devices 130 and the test module 100.

The main memory 40 stores thereon pieces of sequence data of different types and pieces of pattern data corresponding to each piece of sequence data. The main memory 40 may store thereon the sequence data and pattern data supplied from the corresponding site control device 130, before the test of the DUT 300 is conducted.

For example, the site control device 130 may input, into the interface section 12, sequence data, pattern data and an instruction to store the sequence data and pattern data into a designated address of the main memory 40. The pattern generation control section 20 stores the sequence data and pattern data into the main memory 40 in accordance with the instruction received by the interface section 12.

The sequence data may indicate, for example, a group of instructions to be sequentially executed (a test instruction sequence). The pattern data may indicate, for example, a logical value pattern. The pieces of pattern data may be stored in a one-to-one correspondence with a plurality of instructions. For example, the sequence data may be an instruction group for generating test patterns by outputting the pieces of pattern data in a predetermined order.

When the test patterns are generated based on the sequence data, each of the pieces of pattern data may be used more than one time. Here, the sequence data may include therein a loop instruction, a jump instruction and the like, for example. By executing such sequence data, the channel control section 10 expands the corresponding pieces of pattern data so as to generate test signals corresponding to the sequence data and pattern data. The sequence data and pattern data stored on the main memory 40 are described later with reference to FIG. 3.

The pattern list memory 14 stores thereon a pattern list indicating the order in which the pieces of sequence data stored on the main memory 40 are executed. For example, the pattern list memory 14 may store thereon a pattern list which sequentially indicates the address in the main memory 40 at which sequence data to be executed is stored. The pattern list memory 14 may store thereon the pattern list supplied from the corresponding site control device 130, before the test of the DUT 300 is conducted, similarly to the main memory 40. The pattern list may be one example of the above-mentioned test control program, or part of the test control program.

When the test of the DUT 300 is started, the pattern generation control section 20 reads the pattern list from the pattern list memory 14. For example, on reception of an instruction to start a test from the site control device 130, the pattern generation control section 20 may read the pattern list from the pattern list memory 14.

The pattern generation control section 20 reads sequence data stored on the main memory 40, and corresponding pieces of pattern data which are also stored on the main memory 40 in accordance with the order indicated by the pattern list. The pattern generation control section 20 sends the read sequence data to a vector generating section 80 of the pattern generating section 70. Also, the pattern generation control section 20 sends the read pieces of pattern data to a pattern cache memory 90 in the pattern generating section 70.

When a free space of a predetermined size is created in a cache memory, FIFO and the like of the circuits of the subsequent stages, the pattern generation control section 20 may read and send next sequence data and corresponding pieces of pattern data. In this case, under the condition that a free space of a predetermined size is created in each one of the cache memory, FIFO and the like which are designed to store sequence data and corresponding pieces of pattern data, the pattern generation control section 20 may read the next sequence data and corresponding pieces of pattern data, and send the read sequence data and corresponding pieces of pattern data to the cache memory, FIFO and the like.

The pattern generating section 70 sequentially generates a test pattern based on a combination of the sequence data and corresponding pieces of pattern data which is sequentially received from the pattern generation control section 20. According to the present embodiment, the pattern generating section 70 includes therein the vector generating section 80 and pattern cache memory 90.

As described above, the vector generating section 80 receives the sequence data from the pattern generation control section 20. The vector generating section 80 may include therein a sequence cache memory for storing the received sequence data. The pattern cache memory 90 receives the corresponding pieces of pattern data from the pattern generation control section 20, and stores the received pieces of pattern data respectively at predetermined addresses.

The vector generating section 80 sequentially executes the instructions of the sequence data stored on the sequence cache memory, and sequentially designates an address in the pattern cache memory 90. For example, each of the instructions making up the sequence data may be associated with an address of pattern data which is to be designated for the instruction. The vector generating section 80 sequentially designates an address in the pattern cache memory 90, in correspondence with a loop instruction, a jump instruction and the like included in the sequence data.

The pattern cache memory 90 outputs pattern data stored on the sequentially designated address. With the above-described configurations, the pattern generating section 70 can generate test patterns having logical patterns, based on the sequence data and corresponding pieces of pattern data. When the execution of the sequence data is completed, the storage regions of the sequence cache memory and pattern cache memory 90 on which the sequence data and corresponding pieces of pattern data have been stored may be released. Here, the sequence data may include, at the end of the instruction group, an end instruction indicating the end of the sequence data.

Each of the channel circuits 50 shapes a test signal based on the test pattern output from the pattern generating section 70, and inputs the test signal into the DUT 300. Also, the channel circuit 50 measures an output signal from the DUT 300. The channel circuit 50 includes therein a waveform shaping section 52, a driver 54, a timing generating section 56, a comparator 58, a timing comparing section 60, a judging section 62, and a capture memory 64.

The waveform shaping section 52 shapes the test signal based on the test pattern generated by the pattern generating section 70. For example, the waveform shaping section 52 may generate the test signal having a logical pattern corresponding to the test pattern. The waveform shaping section 52 may generate the test signal in accordance with a timing signal supplied thereto. For example, the waveform shaping section 52 may generate the test signal the logical value of which transits in synchronization with the timing signal supplied thereto.

The driver 54 inputs the test signal generated by the waveform shaping section 52 into the DUT 300. The driver 54 may convert the level of the voltage of the test signal into the level of the signal to be input into the DUT 300, by outputting a voltage of a predetermined H level when the test signal generated by the waveform shaping section 52 indicates the H logic, and outputting a voltage of a predetermined L level when the test signal indicates the L logic.

The comparator 58 may receive the output signal from the DUT 300, and compare the voltage level of the output signal with a predetermined reference level, so as to convert the output signal into a binary logical signal. For example, the comparator 58 may output the H logic when the voltage level of the output signal is higher than the reference level, and output the L logic when the voltage level of the output signal is equal to or lower than the reference level.

The timing comparing section 60 obtains the logical value of the signal output from the comparator 58 in synchronization with a strobe signal supplied thereto. In this way, the timing comparing section 60 can detect the logical pattern of the output signal.

The timing generating section 56 generates the above-mentioned timing signal and strobe signal based on the values of the timing set supplied thereto in advance. For example, the timing generating section 56 may generate the timing signal and strobe signal by delaying a rate signal which has a rate determined based on the timing set and is supplied thereto from the rate generating section 30, by a time delay determined in accordance with the timing set supplied thereto.

Here, the timing set may be supplied to the rate generating section 30 and timing generating section 56 every time the pattern generating section 70 executes one of the instructions making up sequence data, for example. The data of the timing set may be stored on the main memory 40, for example, in a state of being included in the pieces of pattern data corresponding to the sequence data. Every time the pattern generating section 70 executes one of the instructions making up sequence data, the pattern generating section 70 may assign the timing set corresponding to the executed instruction to the rate generating section 30 and timing generating section 56.

The judging section 62 compares the logical pattern detected by the timing comparing section 60 with an expected value pattern. In this way, the judging section 62 can judge whether the DUT 300 is acceptable. The expected value pattern may be generated by the pattern generating section 70. For example, the expected value pattern may be the same as the logical pattern of the test signal input into the DUT 300 which is included in the test pattern generated by the pattern generating section 70.

The capture memory 64 stores thereon the result of the judgment made by the judging section 62. For example, the capture memory 64 may store thereon the result of the judgment (pass or fail) made by the judging section 62 in association with each test pattern. The capture memory 64 may select and store thereon the fail results of the judgment made by the judging section 62.

The result memory 16 of the channel control section 10 stores thereon the results of the judgment made by the judging section 62 of each of the channel circuits 50. The result memory 16 may store the result of the judgment (pass or fail) made by the judging section 62 in terms of each test pattern, in association with each of the channel circuits 50. The result memory 16 may select and store the fail results of the judgment made by the judging section 62 of each of the channel circuits 50.

As described above, the capture memory 64 may store thereon fail information for each test pattern, in association with the corresponding channel circuit 50. On the other hand, the result memory 16 may store fail information for each piece of sequence data stored on the pattern list memory 14, in association with, for example, the corresponding DUT 300.

FIG. 3 illustrates, as an example, the pattern list stored on the pattern list memory 14, the sequence data and pattern data stored on the main memory 40. As mentioned above, the main memory 40 stores thereon a plurality of pieces of sequence data (sequence data 1, sequence data 2, . . . ) and pieces of pattern data corresponding to each piece of sequence data.

As described above, a piece of sequence data includes therein a plurality of instructions. When executing each of the instructions, the pattern generating section 70 may output pattern data corresponding to the executed instruction. For example, the sequence data may include a NOP instruction, a JMP instruction, a LOOP instruction and the like. When executing the NOP instruction, the pattern generating section 70 outputs corresponding pattern data and moves to the next instruction. When executing the JMP instruction, the pattern generating section 70 outputs corresponding pattern data and jumps to an instruction at a predetermined address. When executing the LOOP instruction, the pattern generating section 70 outputs corresponding pattern data and repeatedly executes one or more instructions at a designated range of addresses at a predetermined number of times.

By executing a group of the above-described instructions, the pattern generating section 70 outputs the corresponding pieces of pattern data in the order determined by the sequence data, thereby generating predetermined test patterns. For example, when executing the sequence data 2, the pattern generating section 70 first outputs pattern data A, and then repeatedly outputs pieces of pattern data from pattern data B to pattern data C at a certain number of times which is designated by the LOOP instruction.

Here, the main memory 40 may store thereon sequence data corresponding to more than one channel circuit 50. The main memory 40 may store thereon pattern data corresponding to each of the channel circuits 50. For example, the main memory 40 may store thereon pattern data corresponding to each of the channel circuits 50, in association with each of the instructions making up the sequence data. According to the example shown in FIG. 3, the main memory 40 stores pattern data corresponding to each of the channel circuits 50 at a different bit position, at each of the addresses.

The pattern list memory 14 stores thereon the order of executing the pieces of sequence data. According to the example shown in FIG. 3, the pattern list memory 14 stores thereon a pattern list indicating that the sequence data 2 is first executed, and the sequence data 1 is then executed.

According to the exemplary configuration shown in FIG. 2, the main memory 40 for storing sequence data and pattern data is provided in the channel control section 10. In other embodiments, however, the main memory 40 provided in the channel control section 10 may store the sequence data, and a different memory may be provided in each of the channel circuits 50 for storing pattern data for the corresponding channel circuit 50.

If such is the case, the pattern cache memory 90 may be provided in each of the channel circuits 50. The address which is sequentially designated by the vector generating section 80 may be delivered to the pattern cache memory 90 provided in each of the channel circuits 50.

Figure 4:
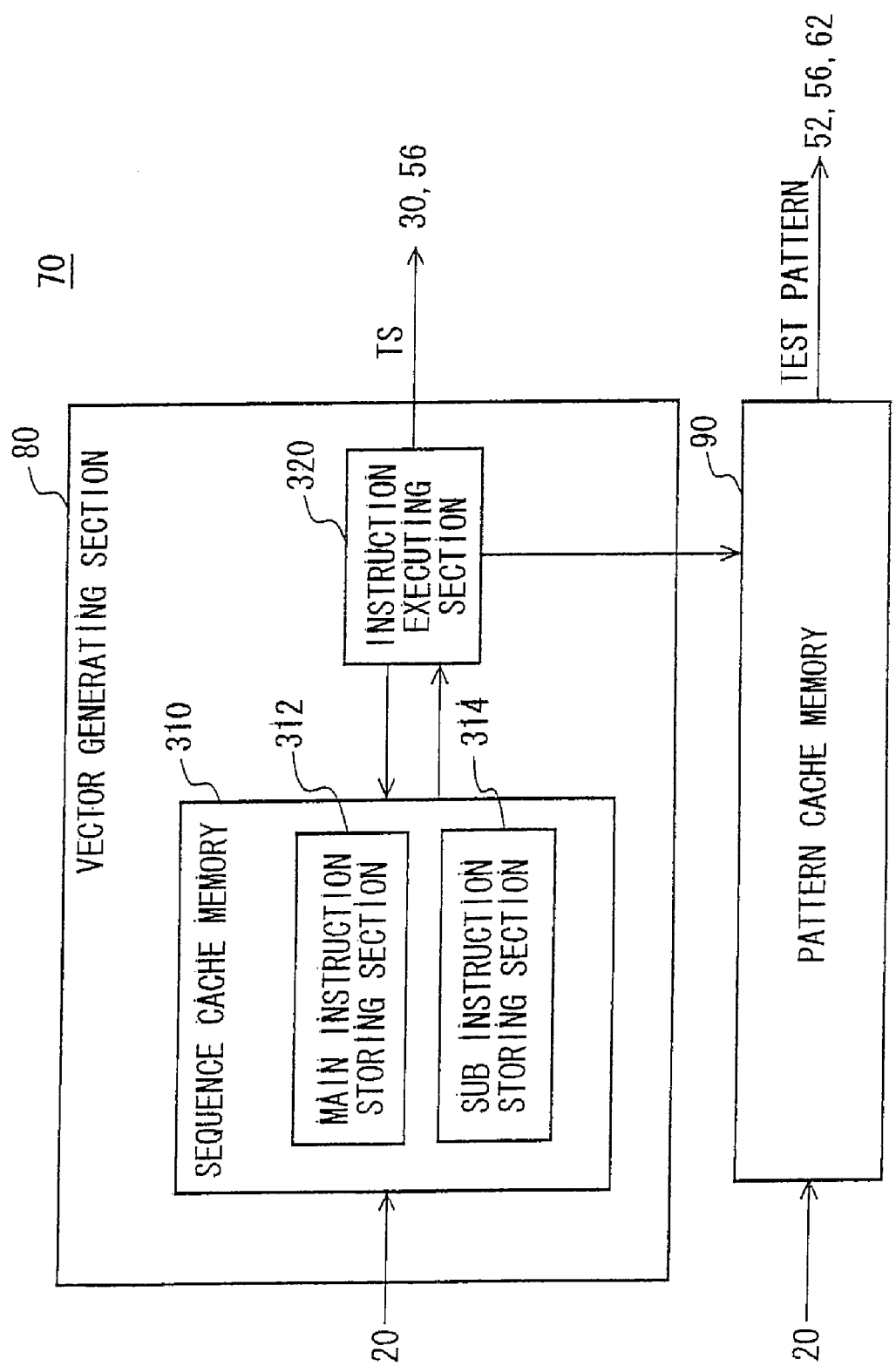
FIG. 4 illustrates an exemplary configuration of a pattern generating section 70 relating to an embodiment of the present invention.

FIG. 4 illustrates an exemplary configuration of the pattern generating section 70 relating to the present embodiment. The vector generating section 80 includes therein a sequence cache memory 310 and an instruction executing section 320.

The sequence cache memory 310 receives the sequence data (a test instruction sequence) from the pattern generation control section 20, and stores thereon the received sequence data. The sequence cache memory 310 includes therein a main instruction storing section 312 and a sub instruction storing section 314. The main instruction storing section 312 stores thereon a main test instruction sequence included in the sequence data. The sub instruction storing section 314 stores thereon a sub test instruction sequence included in the sequence data. The sub test instruction sequence is executed when a subroutine call instruction included in the main test instruction sequence is executed.

The instruction executing section 320 sequentially reads an instruction from the main test instruction sequence and executes the read instruction. Here, each of the instructions making up the main and sub test instruction sequences is assigned with an offset indicating the position of the instruction within the main or sub test instruction sequence.

When executing the instruction, the instruction executing section 320 converts the offset assigned to the executed instruction into an address in the pattern cache memory 90 at which pattern data corresponding to the executed instruction is stored. The instruction executing section 320 then supplies the address to the pattern cache memory 90, and causes the pattern cache memory 90 to output the pattern data corresponding to the executed instruction. The pattern cache memory 90 supplies the pattern data, as a test pattern, to the waveform shaping section 52, timing generating section 56 and judging section 62.

Here, each of the instructions making up the main and sub test instruction sequences is associated with timing set information (TS) designating a combination of timings for output of the corresponding test pattern. When executing the instruction, the instruction executing section 320 outputs the timing set information associated with the executed instruction, to the rate generating section 30 and timing generating section 56, in association with the test pattern output from the pattern cache memory 90. Here, the timing set information may be stored on the pattern cache memory 90, together with the test pattern. If such is the case, the instruction executing section 320 causes the pattern cache memory 90 to output the timing set information associated with the executed instruction and supply the timing set information to the rate generating section 30 and timing generating section 56.

Here, the instruction executing section 320 executes the instructions making up the main test instruction sequence, from the initial instruction thereof, in the order defined by the main test instruction sequence. Here, the instruction executing section 320 repeatedly performs an operation of executing an instruction, identifying the offset of the next instruction to execute which is determined by the executed instruction, reading the instruction which is assigned with the identified offset from the test instruction sequence, and executing the read instruction.

Figure 5:
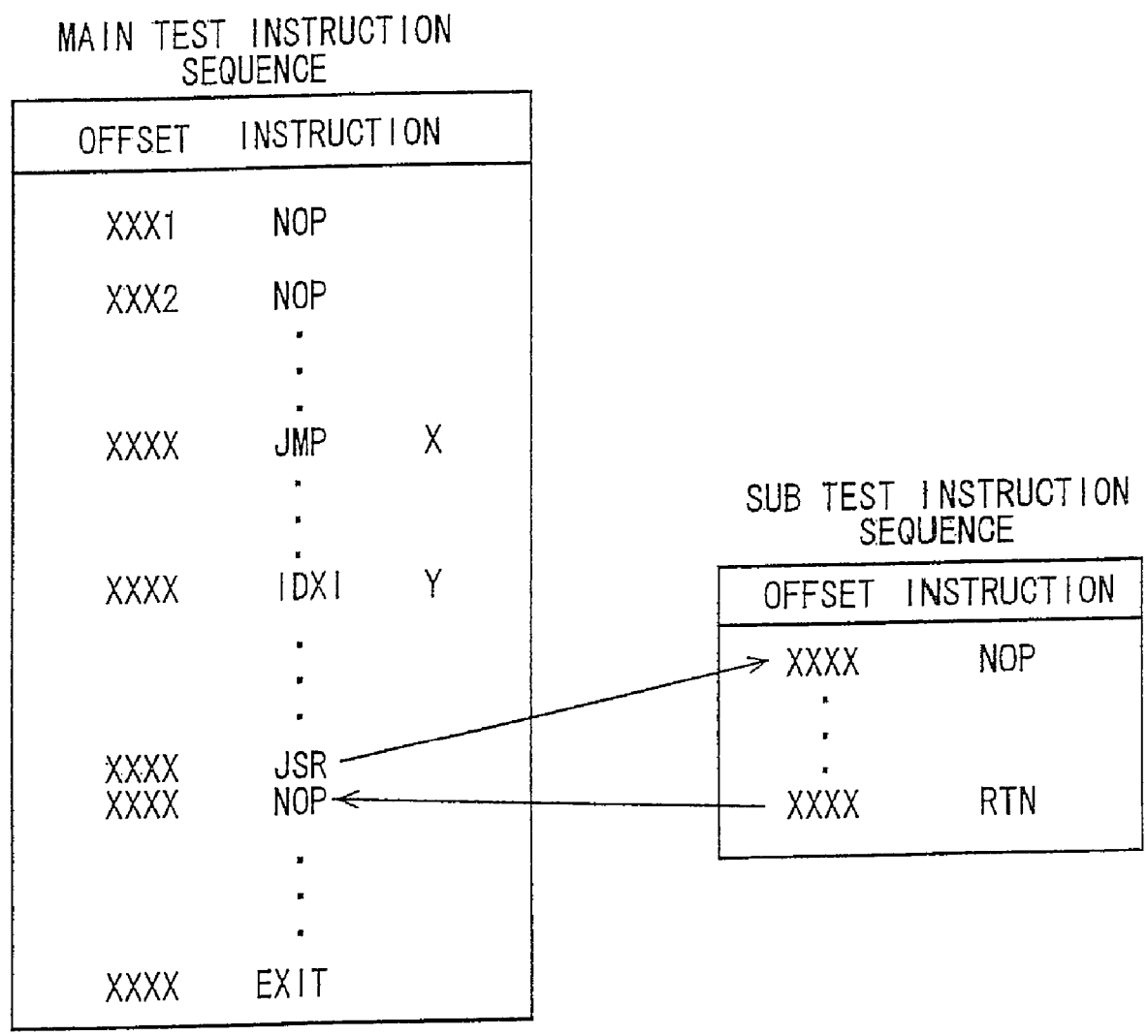
FIG. 5 illustrates an example of sequence data (a main test instruction sequence and a sub test instruction sequence).

FIG. 5 illustrates an example of the sequence data (the test instruction sequence). The sequence data may include a NOP instruction, a jump instruction (a JMP instruction), a standby instruction (an IDXI instruction), a subroutine call instruction (a JSR instruction), a subroutine return instruction (a RTN instruction), and an end instruction (an EXIT instruction), for example.

When executing the NOP instruction, the instruction executing section 320 identifies, as the next instruction to execute, an instruction assigned with an offset which immediately follows the offset assigned to the executed NOP instruction. When executing the jump instruction (the JMP instruction), the instruction executing section 320 identifies, as the next instruction to execute, an instruction assigned with an offset designated by the executed JMP instruction.

The standby instruction (the IDXI instruction) is an instruction to cause corresponding pattern data to be repeatedly output at the designated number of times. When executing the IDXI instruction, the instruction executing section 320 does not process the next instruction until the number of cycles reaches the designated number after the instruction executing section 320 executes the IDXI instruction. When executing the IDXI instruction, the instruction executing section 320 identifies, as the next instruction to execute, an instruction assigned with an offset winch immediately follows the offset of the executed IDXI instruction, after the number of cycles reaches the designated number.

The subroutine call instruction (the JSR instruction) is an instruction to call a designated subroutine and execute the called subroutine. When executing the JSR instruction, the instruction executing section 320 identifies, as the next instruction to execute, an initial instruction of the subroutine designated by the executed JSR instruction.

The subroutine return instruction (the RTN instruction) is an instruction to end the execution of the sub test instruction sequence and return to the instruction which has called the subroutine. When executing the RTN instruction, the instruction executing section 320 identifies, as the next instruction to execute, an instruction, within the main test instruction sequence, assigned with an offset which immediately follows the offset of the subroutine call instruction (the JSR instruction) which has called the subroutine.

The end instruction (the EXIT instruction) is an instruction to end the execution of the main test instruction sequence. When executing the EXIT instruction, the instruction executing section 320 does not identify the next instruction to execute, and ends the execution of the main test instruction sequence.

Figure 6:
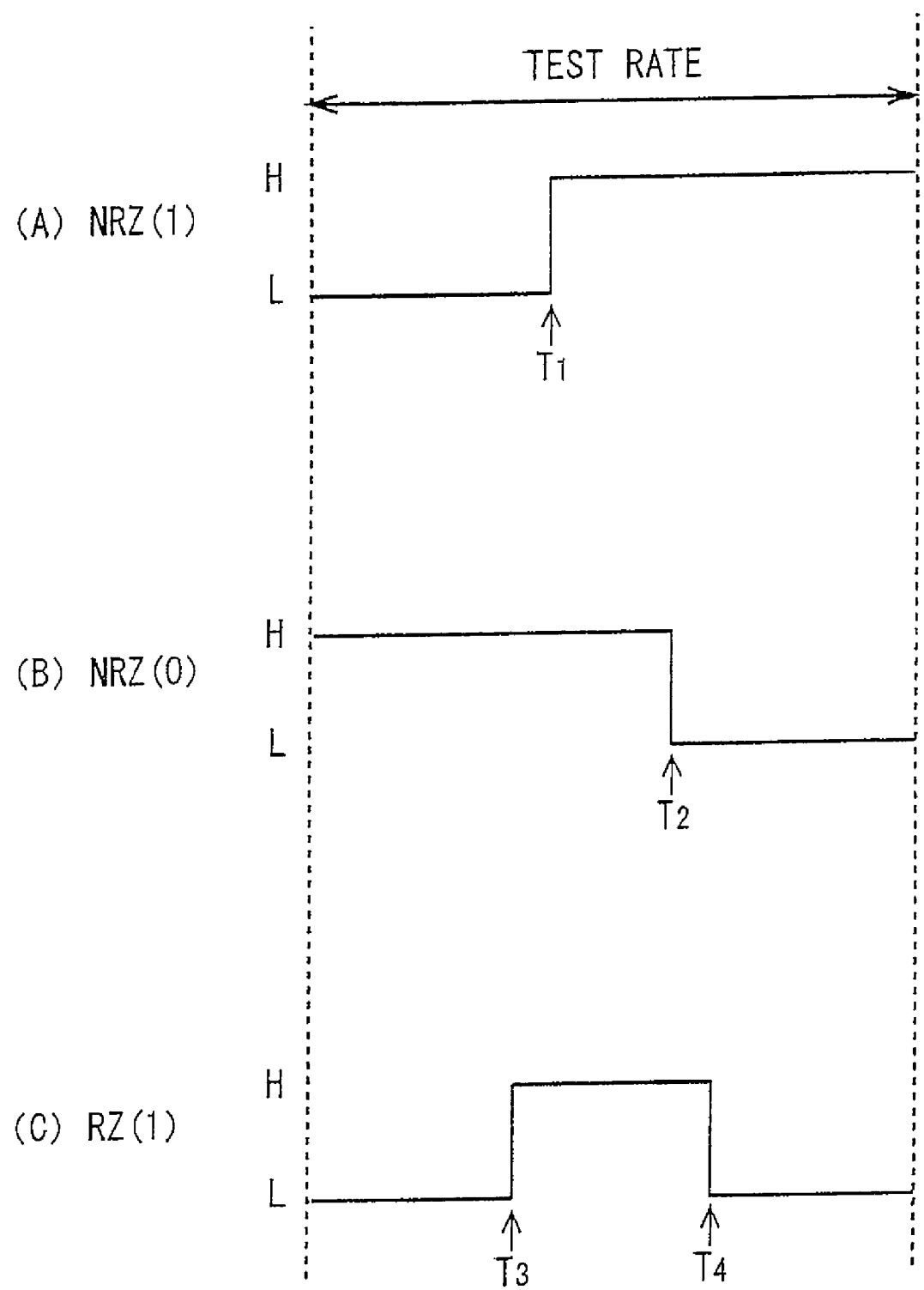
FIG. 6 illustrates, as an example, a test rate and change points which are designated by a timing set.

FIG. 6 illustrates, as an example, the test rate and change points which are designated by the timing set. FIG. 7 illustrates a table describing the setting of the timing set.

Each of the channel circuits 50 is shown as an example of a test signal output section relating to the present invention. The channel circuit 50 generates the test signal in accordance with the test pattern and supplies the generated test signal to the DUT 300 in accordance with the timing designated by the timing set information. As the test signal generated in accordance with the test pattern, the channel circuit 50 may supply, for example, an NRZ waveform (see (A) and (B) in FIG. 6, for example) and an RZ waveform (see (C) in FIG. 6, for example), to the DUT 300. If this is the case, the channel circuit 50 outputs the waveform designated by the test pattern (for example, the NRZ waveform or RZ waveform), in accordance with the period (the test rate) included in the timing set designated by the timing set information. More specifically, the channel circuit 50 outputs the waveform (for example, the NRZ waveform or RZ waveform) which is shaped so that the phase of the change point (the rising or falling edge) coincides with an appropriate one of the phases ($T_1$ to $T_4$) included in the timing set designated by the timing set information.

As shown in FIG. 7, the instruction executing section 320 may output, as the timing set information, a set number designating a combination of, for example, a test rate (Rate) and a time delay of each waveform from the reference phase of the test rate to the change point ($T_1$ to $T_4$). When a timing set table is provided in advance which describes a plurality of combinations of the test rate (Rate) and time delays ($T_1$ to $T_4$) in a one-to-one correspondence with a plurality of set numbers (for example TS1 to TS256), for example, the instruction executing section 320 may output one of the set numbers as the timing set information.

The instruction executing section 320 supplies the above-described timing set information to the rate generating section 30 and timing generating section 56. For example, the rate generating section 30 prestores thereon the timing set table, and selects the test rate included in the timing set designated by the timing set information (the set number) supplied thereto. The rate generating section 30 then generates a pulse signal indicating the reference phase for the selected test rate (Rate), and supplies the generated pulse signal to the timing generating section 56.

The timing generating section 56 receives the test pattern and timing set information. For example, the timing generating section 56 prestore thereon the timing set table, and selects a time delay corresponding to the waveform designated by the received test pattern from a plurality of time delays included in the timing set designated by the received timing set information (the set number).

The timing generating section 56 delays the pulse signal generated by the rate generating section 30 by the selected time delay, to generate the timing signal. The timing generating section 56 supplies the generated timing signal to the waveform shaping section 52. The waveform shaping section 52 shapes the waveform designated by the test pattern so as to vary at the timing designated by the timing signal. The waveform shaping section 52 outputs the shaped waveform as the test signal.

Also, the timing generating section 56 generates the strobe signal indicating a timing which coincides with, for example, substantially the middle of the test rate, based on the pulse signal generated by the rate generating section 30. The timing generating section 56 supplies the generated strobe signal to the timing comparing section 60. The timing comparing section 60 obtains the logical value of the output signal from the DUT 300 which is received from the comparator 58, in synchronization with the timing indicated by the strobe signal supplied thereto from the timing generating section 56.

Figure 8:
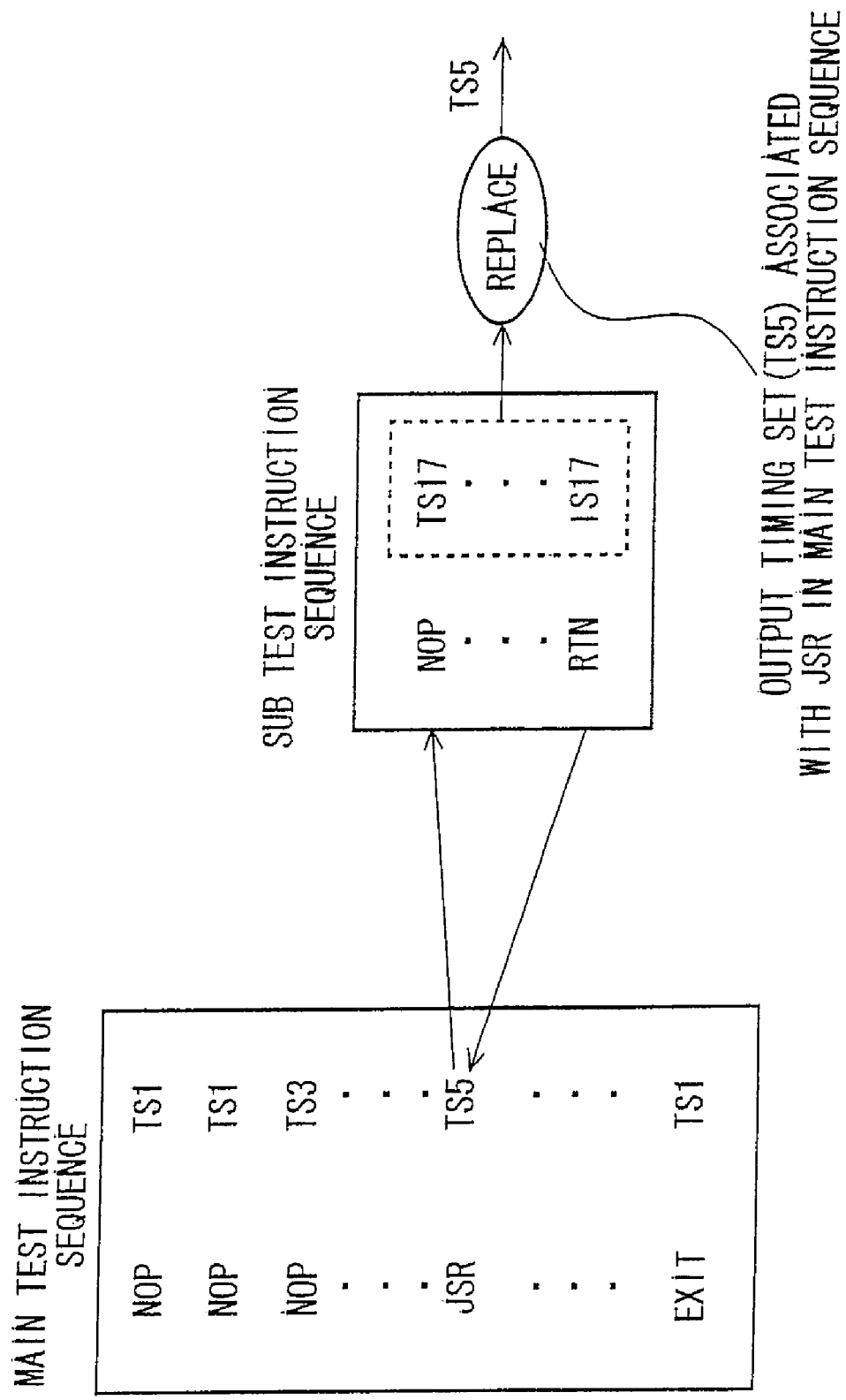
FIG. 8 illustrates, as an example, a main test instruction sequence, a sub test instruction sequence, and replacement of timing set information.

FIG. 8 illustrates, as an example, the main test instruction sequence, the sub test instruction sequence, and replacement of the timing set information. As mentioned earlier, the main test instruction sequence may include therein a subroutine call instruction (a JSR instruction). Under the condition of executing the subroutine call instruction (the JSR instruction), the instruction executing section 320 executes a sub test instruction sequence designated by the executed subroutine call instruction (the JSR instruction) by sequentially reading and executing an instruction, from the initial instruction.

When executing each of the instructions included in the sub test instruction sequence, the instruction executing section 320 outputs timing set information for a test pattern associated with the subroutine call instruction (the JSR instruction) or an instruction which precedes the subroutine call instruction (the JSR instruction) in the main test instruction sequence. Which is to say, when executing each of the instructions included in the sub test instruction sequence, the instruction executing section 320 outputs the timing set information associated with the subroutine call instruction (the JSR instruction) or the instruction which precedes the subroutine call instruction (the JSR instruction) which has called the sub test instruction sequence, in place of the timing set information associated with each of the instructions included in the sub test instruction sequence. For example, the instruction executing section 320 may output the timing set information designated by the subroutine call instruction (JSR instruction) in the main test instruction sequence.

With the above configuration, the instruction executing section 320 enables an instruction included in the main test instruction sequence to designate a combination of timings for the output of a test pattern corresponding to each of the instructions included in the sub test instruction sequence. In this way, the test apparatus 200 can store, as a set of sequence data and pattern data for a single subroutine, a plurality of sets of the sequence data and pattern data for subroutines which generate the same test pattern but have different pieces of timing set information. As a consequence, the test apparatus 200 can reduce the memory region for storing thereon subroutines.

The instruction executing section 320 may include therein an inherit mode register which designates whether to inherit timing set information, for example. For example, the corresponding site control device 130 may set, prior to a test, the inherit mode register so as to indicate the inherit mode according to which the timing set information is inherited. When this configuration is adopted, under the condition that the inherit mode register is not set to indicate the inherit mode, the instruction executing section 320 outputs the timing set information for the test pattern associated with each of the instructions included in the sub test instruction sequence, when executing each of the instructions included in the sub test instruction sequence. On the other hand, under the condition that the inherit mode register is set to indicate the inherit mode, the instruction executing section 320 outputs the timing set information for the test pattern associated with the subroutine call instruction or the instruction, within the main test instruction sequence, which is executed before the subroutine call instruction, in place of the timing set information for the test pattern associated with each of the instructions included in the sub test instruction sequence, when executing each of the instructions included in the sub test instruction sequence. With the above-described configuration, the test apparatus 200 can adaptively control whether to replace the timing set information for the test pattern associated with each of the instructions included in the sub test instruction sequence with the timing set information designated by an instruction included in the main test instruction sequence.

Figure 9:
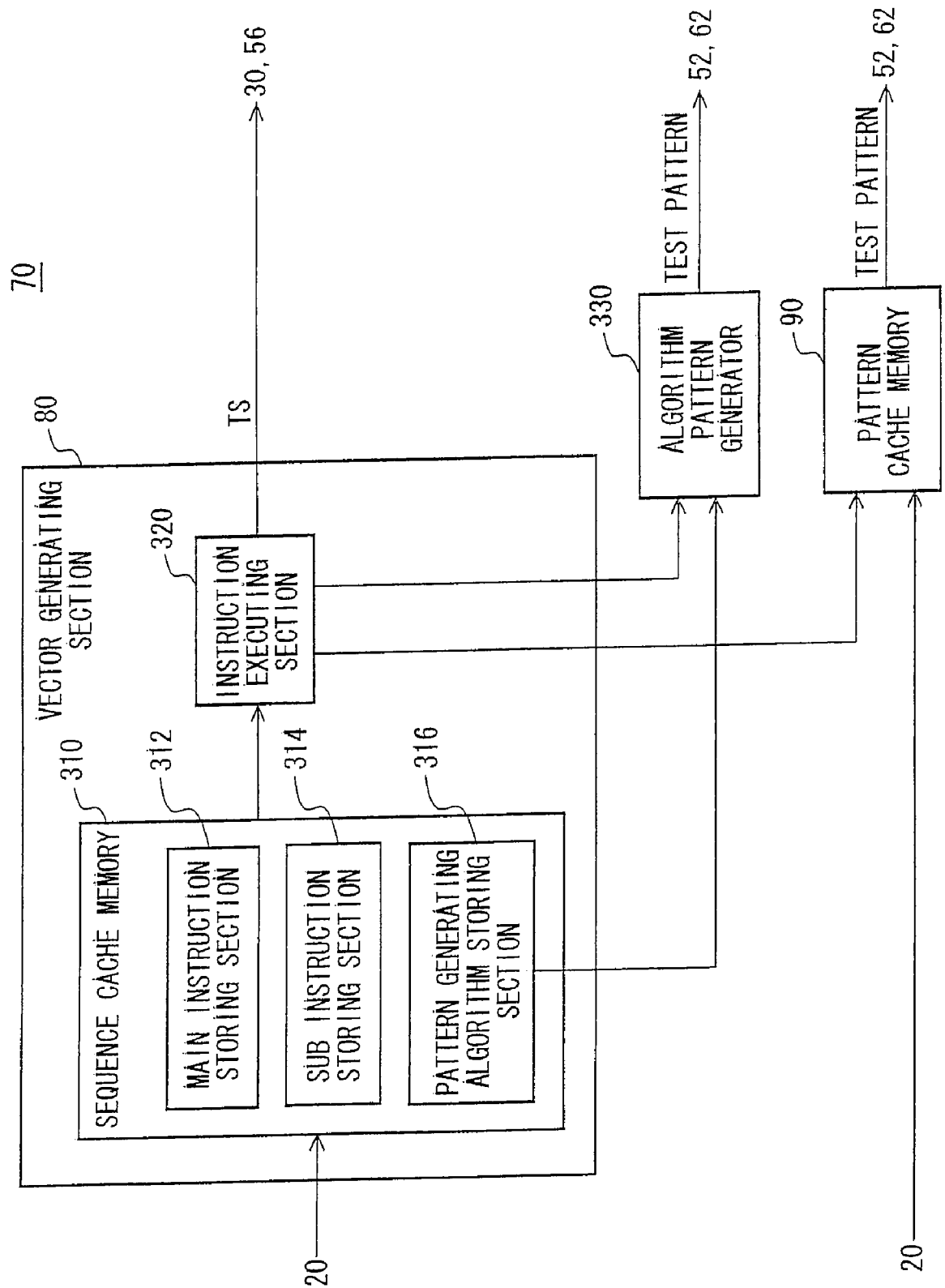
FIG. 9 illustrates an exemplary configuration of the pattern generating section 70 relating to a modification example of the embodiment of the present invention.

FIG. 9 illustrates an exemplary configuration of the pattern generating section 70 relating to a modification example of the embodiment of the present invention. The constituents of the pattern generating section 70 relating to the modification example which are assigned with the same reference numerals as in FIG. 4 have substantially the same configurations and functions as the corresponding constituents of the pattern generating section 70 relating to the embodiment shown in FIG. 4. Therefore, the following description is made only with focus on the differences.

The pattern generating section 70 relating to the modification example further includes therein an algorithm pattern generator 330. The algorithm pattern generator 330 generates a test pattern in accordance with a pattern generating algorithm supplied thereto. The pattern generating algorithm may be a test instruction sequence including an operation instruction designating an arithmetic expression, for example. The algorithm pattern generator 330 may include therein an operational circuit, for example. When supplied with an operation instruction via the pattern generating algorithm, the algorithm pattern generator 330 performs a designated operation, and generates a test pattern corresponding to the result of the operation.

For example, the algorithm pattern generator 330 is executed when an algorithm call instruction (a JAL instruction) included in the main test instruction sequence is executed. When executed, the algorithm pattern generator 330 supplies the test pattern to one of the channel circuits 50 corresponding to a designated pin, in place of the pattern cache memory 90.

The sequence cache memory 310 further includes therein a pattern generating algorithm storing section 316. The pattern generating algorithm storing section 316 stores thereon the pattern generating algorithm to be executed by the algorithm pattern generator 330. Here, each of the instructions included in the pattern generating algorithm is associated with timing set information for the test pattern to be generated.

When the pattern generating section 70 is configured by further including therein the algorithm pattern generator 330, the sequence data may include an algorithm call instruction (a JAL instruction) and an algorithm return instruction (an EXITAL instruction), for example. The algorithm call instruction (the JAL instruction) is an instruction to call and execute a designated pattern generating algorithm. When executing the JAL instruction, the instruction executing section 320 identifies, as the next instruction to execute, an operation instruction at the start of the pattern generating algorithm designated by the executed JAL instruction.

The algorithm return instruction (the EXITAL instruction) is an instruction to end the execution of the pattern generating algorithm and return to the instruction which has called the pattern generating algorithm. When executing the EXITAL instruction, the instruction executing section 320 identifies, as the next instruction to execute, an instruction, within the main test instruction sequence, which is assigned with an offset which immediately follows the offset of the algorithm call instruction (the JAL instruction) which has called the pattern generating algorithm.

Figure 10:
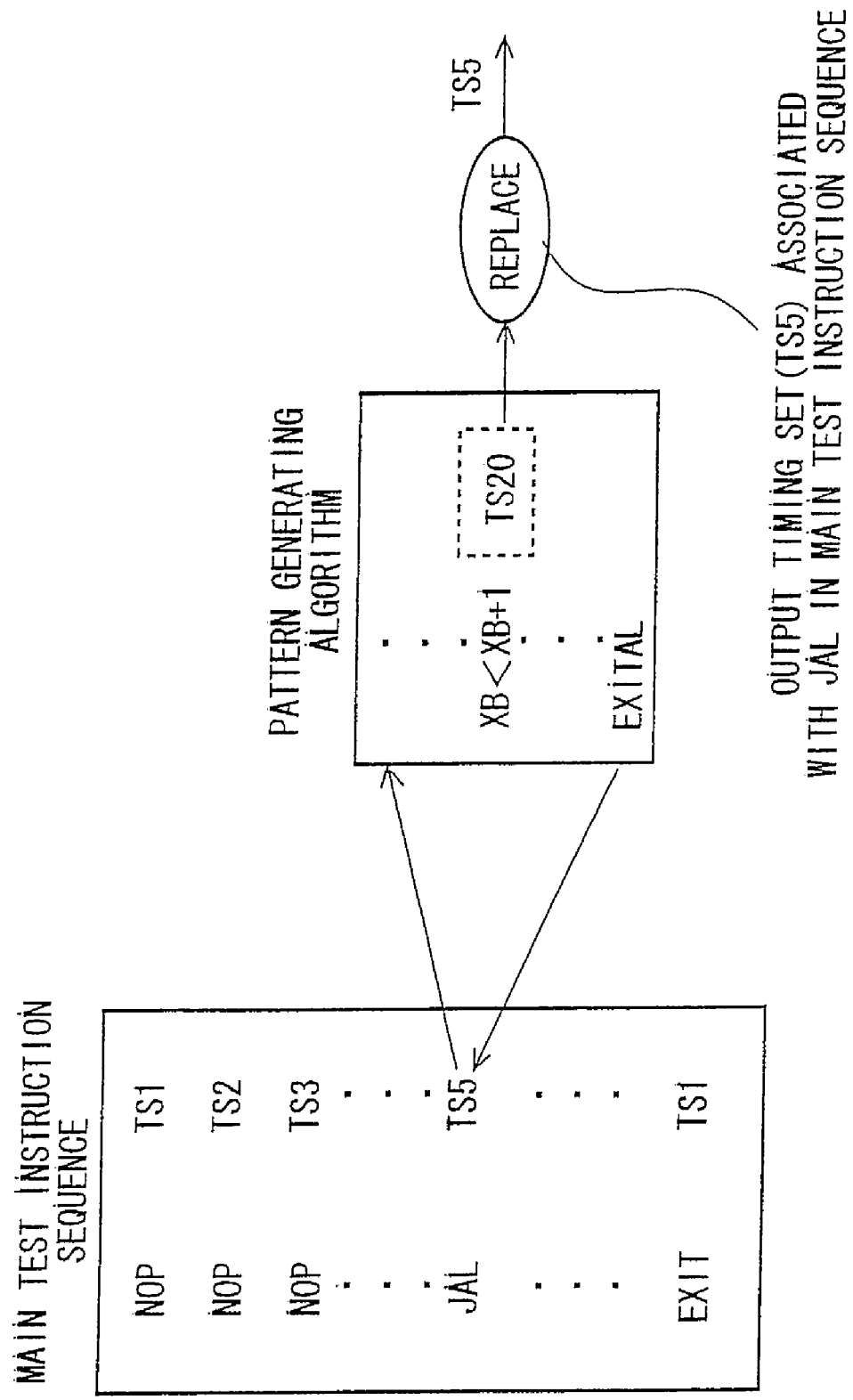
FIG. 10 illustrates, as an example, a main test instruction sequence, a pattern generating algorithm to be executed by an algorithm pattern generator 330, and replacement of timing set information.

FIG. 10 illustrates, as an example, the main test instruction sequence, the pattern generating algorithm executed by the algorithm pattern generator 330, and replacement of the timing set information. Under the condition of executing the algorithm call instruction (the JAL instruction), the instruction executing section 320 causes the algorithm pattern generator 330 to read a pattern generating algorithm designated by the executed algorithm call instruction (the JAL instruction). The instruction executing section 320 then causes the algorithm pattern generator 330 to perform an operation in accordance with each of the operation instructions included in the read pattern generating algorithm and output a test pattern corresponding to the result of the operation.

When executing the pattern generating algorithm, the instruction executing section 320 outputs the timing set information for the test pattern associated with the algorithm call instruction (the JAL instruction) or an instruction which precedes the algorithm call instruction (the JAL instruction) in the main test instruction sequence. For example, the instruction executing section 320 may output the timing set information designated by the algorithm call instruction (the JAL instruction) within the main test instruction sequence.

With the above configuration, the instruction executing section 320 enables an instruction included in the main test instruction sequence to determine a combination of timings for the output of the test pattern in accordance with the pattern generating algorithm. In this way, the test apparatus 200 can store, as a single pattern generating algorithm, pattern generating algorithms which are associated with different pieces of timing set information but generate the same test pattern. As a consequence, the test apparatus 200 can reduce the memory region for storing thereon pattern generating algorithms.

Here, the corresponding site control device 130 may set the instruction executing section 320, for example prior to a test, to an inherit mode designating that the timing set information is inherited, for example. When this configuration is adopted, under the condition that the instruction executing section 320 is set to indicate the inherit mode, the instruction executing section 320 outputs the timing set information for the test pattern associated with the algorithm call instruction or the instruction, within the main test instruction sequence, which is executed before the algorithm call instruction, in place of the timing set information for the test pattern output in accordance with the pattern generating algorithm.

Figure 11:
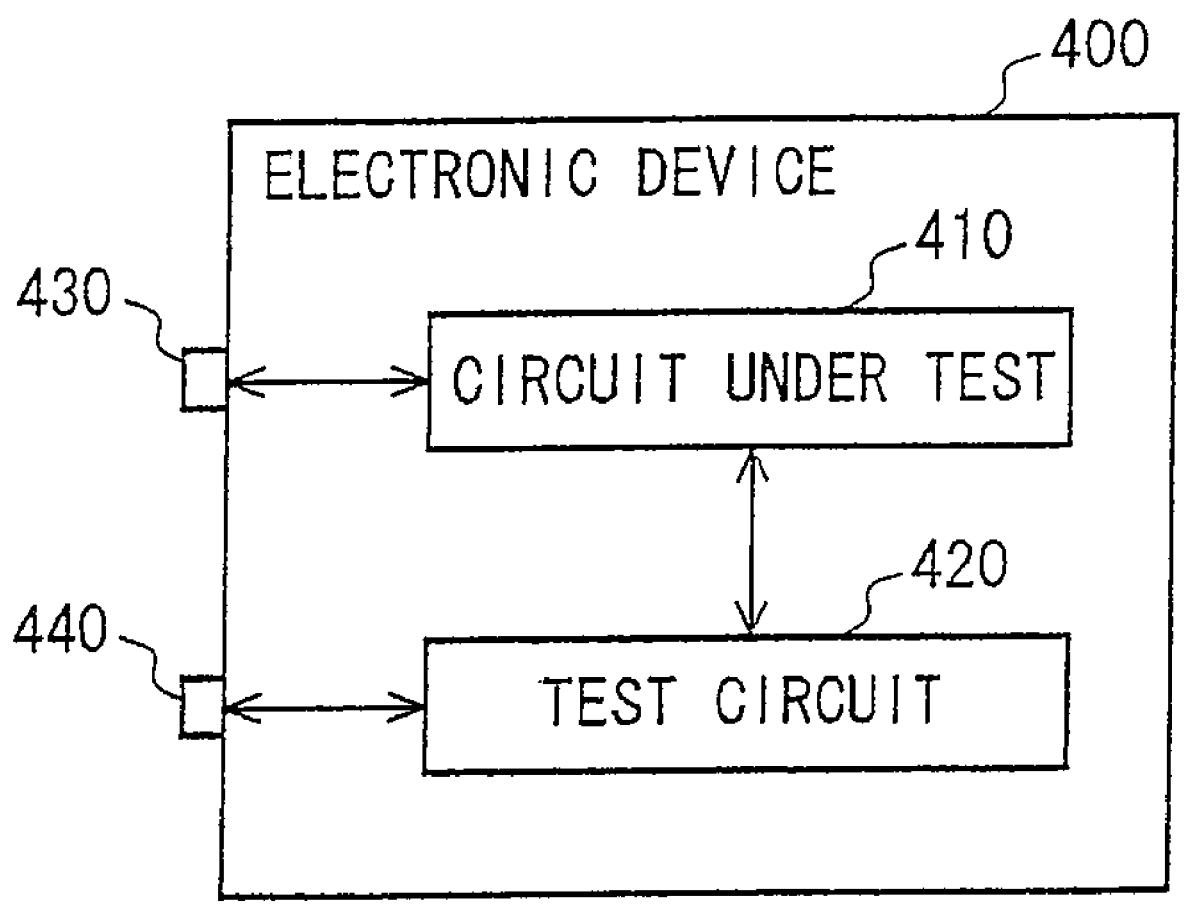
FIG. 11 illustrates an exemplary configuration of an electronic device 400 relating to an embodiment of the present invention.

FIG. 11 illustrates an exemplary configuration of an electronic device 400 relating to an embodiment of the present invention. The electronic device 400 includes therein a circuit under test 410, a test circuit 420, an input/output pin 430, and a BIST pin 440. The circuit under test 410 may be a circuit which operates when the electronic device 400 is mounted. The circuit under test 410 operates in accordance with a signal supplied thereto from the input/output pin 430 when the electronic device 400 is mounted.

When the electronic device 400 is a memory device, for example, the circuit under test 410 may be a circuit including a memory cell of the electronic device 400. For example, the circuit under test 410 may include the memory cell and a control circuit for controlling the memory cell. The control circuit may be a circuit for controlling writing of data into the memory cell and reading of data from the memory cell.

The test circuit 420 is provided on the same semiconductor chip as the circuit under test 410. The test circuit 420 tests the circuit under test 410. The test circuit 420 may have the same constituents as the test module 100 described with reference to FIGS. 1 to 10. Alternatively, the test circuit 420 may have some of the constituents of the test module 100. The test circuit 420 may be a circuit which has some of the functions of the test module 100. For example, the test circuit 420 may not include therein the result memory 16. Furthermore, the rate generating section 30 and timing generating section 56 of the test circuit 420 may operate in accordance with the timing set including fixed values.

When supplied with a signal indicating that a self-test for the circuit under test 410 is to be executed, via the BIST pin 440 from an external test apparatus, the test circuit 420 may test the circuit under test 410. The BIST pin 440 is preferably a pin which is not used when the electronic device 400 is mounted. The test circuit 420 may output the result of testing the circuit under test 410, to the external test apparatus via the BIST pin 440.

The external test apparatus may operate in the same manner as the site control devices 130 described with reference to FIG. 1. In other words, the external test apparatus may supply the test control programs, test programs, test data and the like, to the test circuit 420, so as to cause the test circuit 420 to function in the same manner as the test module 100 described with reference to FIGS. 1 to 10.

While one aspect of the present invention has been described through the embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

What is claimed is:

1. A test apparatus for testing a device under test, comprising:
    a main instruction storing section that stores thereon a main test instruction sequence;
    a sub instruction storing section that stores thereon a sub test instruction sequence which is executed when a subroutine call instruction included in the main test instruction sequence is executed;
    a pattern generating section that sequentially reads and executes an instruction from the main test instruction sequence and outputs (I) a test pattern associated with the executed instruction from the main test instruction sequence and (II) timing set information designating a combination of timings for output of the test pattern; and
    a test signal output section that generates a test signal in accordance with the test pattern, and supplies the test signal to the device under test at a timing designated by the timing set information, wherein
    when the subroutine call instruction included in the main test instruction sequence is executed, the pattern generating section sequentially reads and executes an instruction from the sub test instruction sequence designated by the subroutine call instruction and outputs (1) a test pattern associated with the executed instruction from the sub test instruction sequence and (2) timing set information for a test pattern associated with the subroutine call instruction or an instruction which precedes the subroutine call instruction in the main test instruction sequence.

2. The test apparatus as set forth in claim 1, wherein
    if an inherit mode is set which designates that the timing set information is inherited, the pattern generating section outputs the timing set information for the test pattern associated with the subroutine call instruction or the instruction, in the main test instruction sequence, which is executed before the subroutine call instruction, in place of timing set information for a test pattern associated with each of instructions included in the sub test instruction sequence.

3. The test apparatus as set forth in claim 1, wherein
    the pattern generating section outputs timing set information designated by the subroutine call instruction in the main test instruction sequence.

4. The test apparatus as set forth in claim 1, further comprising
a pattern generating algorithm storing section that stores thereon a pattern generating algorithm to be executed when an algorithm call instruction included in the main test instruction sequence is executed, wherein
when the algorithm call instruction included in the main test instruction sequence is executed, the pattern generating section reads the pattern generating algorithm designated by the algorithm call instruction, and outputs (i) a test pattern in accordance with the read pattern generating algorithm and (ii) timing set information for a test pattern associated with the algorithm call instruction or an instruction, in the main test instruction sequence, which precedes the algorithm call instruction.

5. The test apparatus as set forth in claim 4, wherein
if that the inherit mode is set, the pattern generating section outputs timing set information for a test pattern associated with the algorithm call instruction or the instruction, in the main test instruction sequence, which is executed before the algorithm call instruction, in place of timing set information for the test pattern output in accordance with the pattern generating algorithm.

6. A test apparatus for testing a device under test, comprising:
a main instruction storing section that stores thereon a main test instruction sequence;
a pattern generating algorithm storing section that stores thereon a pattern generating algorithm which is executed when an algorithm call instruction included in the main test instruction sequence is executed;
a pattern generating section that sequentially reads and executes an instruction from the main test instruction sequence and outputs (I) a test pattern associated with the executed instruction and (II) timing set information designating a combination of timings for output of the test pattern; and
a test signal output section that generates a test signal in accordance with the test pattern, and supplies the test signal to the device under test at a timing designated by the timing set information, wherein
when the algorithm call instruction included in the main test instruction sequence is executed, the pattern generating section reads the pattern generating algorithm designated by the algorithm call instruction and outputs (1) a test pattern in accordance with the read pattern generating algorithm and (2) timing set information for a test pattern associated with the algorithm call instruction or an instruction, in the main test instruction sequence, which precedes the algorithm call instruction.

7. An electronic device comprising:
a circuit under test; and
a test circuit for testing the circuit under test, wherein
the test circuit includes:
a main instruction storing section that stores thereon a main test instruction sequence;
a sub instruction storing section that stores thereon a sub test instruction sequence which is executed when a subroutine call instruction included in the main test instruction sequence is executed;
a pattern generating section that sequentially reads and executes an instruction from the main test instruction sequence and outputs (I) a test pattern associated with the executed instruction and (II) timing set information designating a combination of timings for output of the test pattern; and
a test signal output section that generates a test signal in accordance with the test pattern, and supplies the test signal to the circuit under test at a timing designated by the timing set information, wherein
when the subroutine call instruction included in the main test instruction sequence is executed, the pattern generating section sequentially reads and executes an instruction from the sub test instruction sequence designated by the subroutine call instruction and outputs (1) a test pattern associated with the executed instruction from the sub test instruction sequence and (2) timing set information for a test pattern associated with the subroutine call instruction or an instruction which precedes the subroutine call instruction in the main test instruction sequence.

8. An electronic device comprising:
a circuit under test; and
a test circuit for testing the circuit under test, wherein
the test circuit includes:
a main instruction storing section that stores thereon a main test instruction sequence;
a pattern generating algorithm storing section that stores thereon a pattern generating algorithm which is executed when an algorithm call instruction included in the main test instruction sequence is executed;
a pattern generating section that sequentially reads and executes an instruction from the main test instruction sequence and outputs (I) a test pattern associated with the executed instruction and (II) timing set information designating a combination of timings for output of the test pattern; and
a test signal output section that generates a test signal in accordance with the test pattern, and supplies the test signal to the circuit under test at a timing designated by the timing set information, wherein
when the algorithm call instruction included in the main test instruction sequence is executed, the pattern generating section reads the pattern generating algorithm designated by the algorithm call instruction and outputs (1) a test pattern in accordance with the read pattern generating algorithm and (2) timing set information for a test pattern associated with the algorithm call instruction or an instruction which precedes the algorithm call instruction in the main test instruction sequence.

* * * * *